United States Patent [19]
Kim et al.

[11] Patent Number: 5,767,755
[45] Date of Patent: Jun. 16, 1998

[54] RADIO FREQUENCY POWER COMBINER

[75] Inventors: Hong-Kee Kim, Seongman; Young Kim, Seoul; Soon-Chul Jeong, Ahnyang; Chul-Dong Kim, Seoul, all of Rep. of Korea

[73] Assignee: Samsung Electronics Co., Ltd., Kyungki-do, Rep. of Korea

[21] Appl. No.: 740,235

[22] Filed: Oct. 25, 1996

[30] Foreign Application Priority Data

Oct. 25, 1995 [KR] Rep. of Korea ............ 1995/37064

[51] Int. Cl.$^6$ .................... H01P 1/10; H01P 5/12
[52] U.S. Cl. ................ 333/101; 333/104; 333/128
[58] Field of Search .................... 333/101, 103, 333/104, 125, 127, 128

[56] References Cited

U.S. PATENT DOCUMENTS 5,274,343 12/1993 Russell et al. ............... 333/103
5,543,751 8/1996 Stedman et al. ............ 333/128 X

FOREIGN PATENT DOCUMENTS 2-219301 8/1990 Japan ......................... 333/103
2170358 7/1986 United Kingdom .......... 333/128

*Primary Examiner*—Paul Gensler
*Attorney, Agent, or Firm*—Dilworth & Barrese

[57] ABSTRACT

A radio frequency power combiner includes a plurality of transmission lines connecting a plurality of input terminals to an output terminal. An RF switch is positioned between each of the input terminals and a transmission line connecting the output terminal to the input terminal. The electrical length between each RF switch and the output terminal is preferably one half of a wavelength at a central frequency, which may be realized by two transmission lines of different impedances in each path, each a quarter wavelength long. When the switches are on, the signal power applied to all of the input terminals is combined at the output terminal. When any given switch is turned off, the RF power incident to the switch is reflected, and the transmission lines connected between that switch and the output terminal appear as an open circuit. The power combiner can also operate as a power divider. The combiner and/or divider have particular utility in RF amplifier applications, to prevent excessive loss of RF power when one or more of the amplifiers fail, by switching off the RF switch(es) connected to the failed amplifier(s).

23 Claims, 7 Drawing Sheets

RADIO FREQUENCY POWER COMBINER

BACKGROUND OF THE INVENTION

1. Field of the Invention

The present invention relates to a digital cordless communication system, and more particularly, to a radio frequency (RF) power combiner by which the output power of a plurality of power amplifiers which are combined in proportion to the number of power amplifiers is increased with very small loss.

A radio frequency power combiner according to the present invention is based on Korean Application No. 37064/1995 which is incorporated herein by reference.

2. Description of the Related Art

A prior art n-way RF power combiner is disclosed in "Planar electrically symmetric n-way hybrid power dividers/combiners", IEEE Transactions on Microwave Theory and Techniques, Vol. MTT-28, No. 6, June 1980. FIGS. 1A and 1B show prior art RF power combiners, in which FIG. 1A shows a typical structure of an n-way Wilkinson type combiner, and FIG. 1B shows a typical structure of an n-way radial type combiner (with n=1, 2, 3, ... ). The combiner of FIG. 1A includes a quarter wavelength ($\lambda_0/4$) transmission line and resistance R, and the combiner of FIG. 1B includes a half wavelength to a quarter wavelength ($\lambda_0/2$ to $\lambda_0/4$) transmission line.

However, for the power combiners shown in FIGS. 1A and 1B, in combining signals of n power sources having equal amplitude and phase, if m signals among n signals are not supplied, and so are termed "defective", the output power is decreased by $-20 \log (1-m/n)$ dB (with m=0, 1, 2, .... n-1). For example, when m/n=1/4, 2/4 or 3/4, output power decreases of -2.4, -6.0 or -12 dB, respectively, are generated, compared to the case when m/n=0/4. For example, in the 4-way RF power combiner of the prior art used for combining n=4 signals, each having power intensity of 1 watt, the combining characteristics are shown in the following Table 1.

TABLE 1

| Number of input signals (n) | Number of defective signals (m) | Sum power of input signals before combination (watt) | Power after combination (watt) | Loss (%) |
|---|---|---|---|---|
| 4 | 0 | 4 | 4 | 0 |
| 4 | 1 | 3 | 2.25 | 35 |
| 4 | 2 | 2 | 1 | 50 |
| 4 | 3 | 1 | 0.25 | 75 |

As shown in Table 1, the sum power of the input signals before combination is the same as the power of the combined signal only if the number m of defective signals is zero. However, as the number m of the defective signals is increased, the input/output power difference, i.e., the power loss, is increased.

In order to convert the RF power combiner into a high power RF power amplifier by combining the powers of several RF power amplifiers, the RF power combiner is limited in applications with few defective signals, since, when it is necessary to combine the power with a little loss, the number m of the defective signals is required to be small.

FIG. 2 shows a circuit of the prior art with a high power RF amplifier using the RF power combiner, which includes a plurality of RF amplifiers. In manufacturing the high power RF amplifier for generating outputs in proportion with the number of RF amplifiers providing signals to be combined, that is, the amplifier for generating A watts, 2A watts, ...., nA watts, in which the number of RF amplifiers is 1, 2, ...., n, the power amplifier becomes inefficient if the number of the installed amplifiers is small.

SUMMARY OF THE INVENTION

Therefore, it is an object of the present invention to provide an RF power combiner with very small loss with an increase in the output power of combined power amplifiers in proportion to the number of power amplifiers.

It is another object of the present invention to provide a power combiner suitable for a high power RF amplifier.

To achieve the above objects of the present invention, a radio frequency power combiner has a plurality of transmission lines having a plurality of input terminals and an output terminal commonly connected to the input terminals via a common connection node, a first transmission line characteristic impedance being connected between the output terminal and the common connection node, second and third transmission line characteristic impedances being connected between the common connection node and the input terminals, and a length corresponding to each of the transmission line characteristic impedances is $\lambda_0/4$, with $\lambda_0$ being a wavelength of a central frequency signal; and a plurality of RF switches positioned between the input terminals and the third transmission line characteristic impedance, for opening/closing a connection providing an RF signal applied to the input terminals.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

A preferred embodiment of the present invention will be discussed hereinbelow with reference to the accompanying drawings.

Figure 1A:
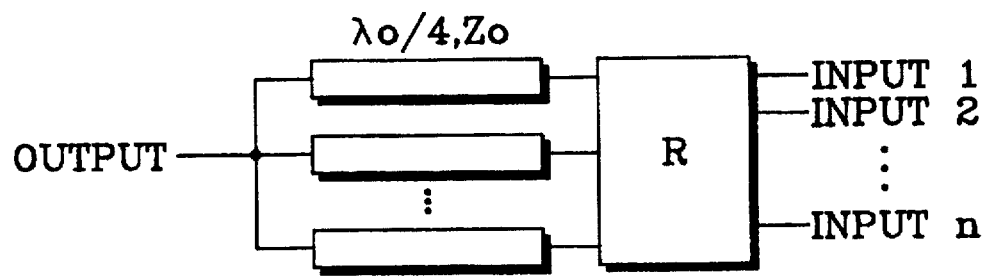
FIGS. 1A and 1B show power combiners in the prior art.
Figure 1B:
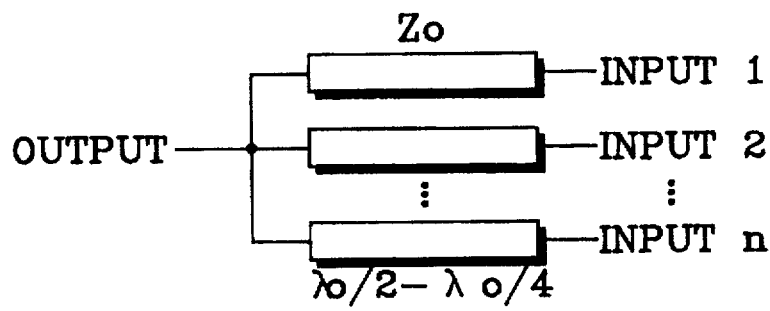
Figure 2:
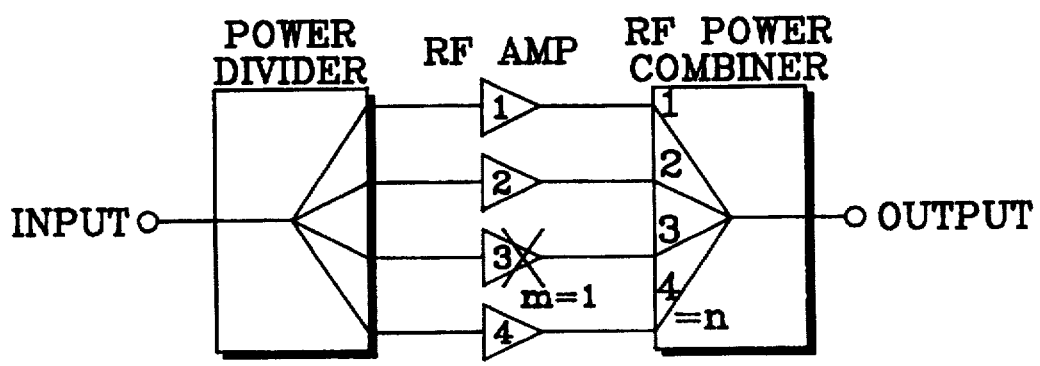
FIG. 2 is a diagram of a high power RF amplifier in the prior art using an RF power combiner.
Figure 3:
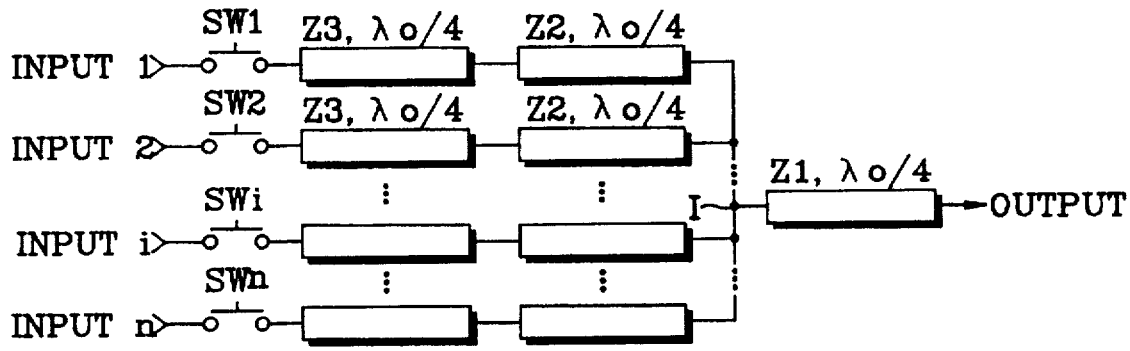
FIG. 3 shows a power combiner according to the present invention.

Referring to FIG. 3, the power combiner 10 according to the present invention includes a transmission line having components forming parallel channels 12, 14, 16, 18 from inputs 20, 22, 24, 26, respectively, to a common output channel 28, with the components having characteristic impedances labelled Z1, Z2 and Z3, respectively, and RF switches 30 labelled SW1 through SWn for opening or closing respective connections providing an RF signal from respective inputs 20–26, labelled INPUT 1, INPUT 2, INPUT i, and INPUT n, respectively.

The power combiner 10 operates according to the settings of the switches 30.

(1) In a first case in which, among the RF switches 30, labelled SW1 through SWn, only one switch is closed and the other switches are open. With respect to point or node 32, the respective channels 12–18 having transmission line impedance (Z2+Z3) connected to the open switches are open half-wavelength transmission lines (at a central frequency). Thus, at the point 32, the signal is totally reflected, that is, the signal is not transmitted, which prevents a loss.

Second, in the path having a closed switch; for example, switch SWi, a signal incoming from the input 24 labelled INPUT i is transmitted to an output port 34, labelled OUTPUT, via an RF signal transmission path, that is, INPUT i→SWi→Z3→Z2→Z1→OUTPUT.

(2) In the case in which, among the RF switches 30 labelled SW1 through SWn, when at least two switches are closed and the other switches are open, with respect to point 32, the respective channels with transmission line impedance (Z2+Z3) which are connected to the open switches are open half-wavelength transmission lines (at a central frequency). Thus, at the point 32, the signal is totally reflected, that is, the signal is not transmitted, which prevents a loss of the signal.

Second, in the path having a closed switch, the signal is transmitted to the output port 34 via the respective transmission lines with impedances (Z2+Z3) and Z1. At this time, the RF signals incoming to the respective input terminals 20–26 are adjusted to be substantially the same in their amplitude and phase. If the amplitude and phase of the incoming RF signals are the same, the impedance becomes infinite, which improves the isolation between the input terminals. Since the combined power is transmitted only to the output port 34, additional power loss can be prevented. Proper values of characteristic impedance Z1, Z2 and Z3 are selected in consideration of the number n of the input signals. In an illustrative embodiment, the power combiner 10 has Z2≧Z3>Z1 as a requirement.

Figure 4:
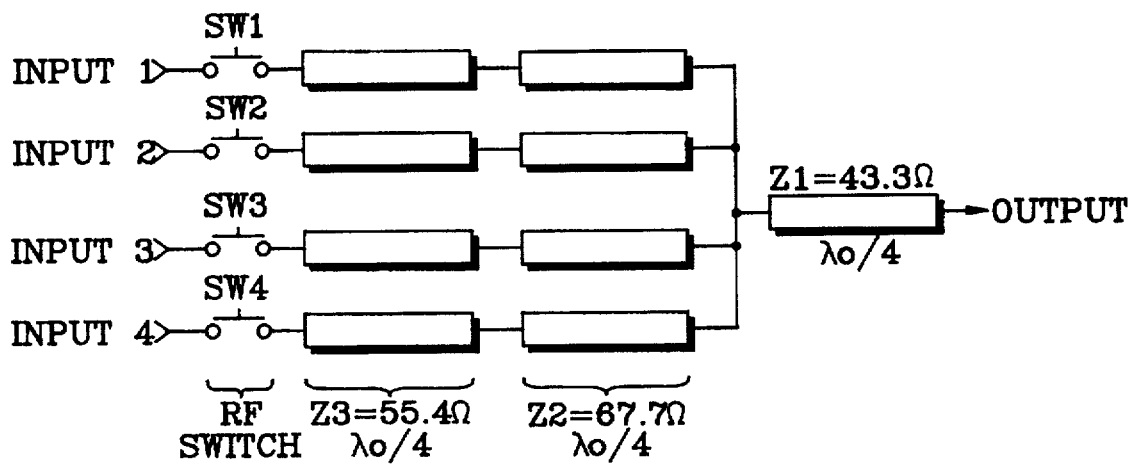
FIG. 4 shows a detailed embodiment of the power combiner according to the present invention.

FIG. 4 shows a detailed embodiment of the power combiner according to the present invention, which, in an illustrative embodiment, has:

(1) the number of input ports n=4;

(2) the central frequency $f_o$=880 MHz;

(3) the range of operational frequencies is 880 MHz±50 MHz; and (4) the amplitude and phase of input signals are all the same.

The following Table 2 shows examples of characteristic values of the circuit configured as described above.

TABLE 2

| Circuit element | Characteristic impedance | Electrical length (l) |
|---|---|---|
| Z1 | 43.3Ω | $\lambda_o/4$ |
| Z2 | 67.7Ω | $\lambda_o/4$ |
| Z3 | 55.4Ω | $\lambda_o/4$ |

In this example, $\lambda_o$ is a wavelength of a 880 MHz frequency signal.

Figure 5:
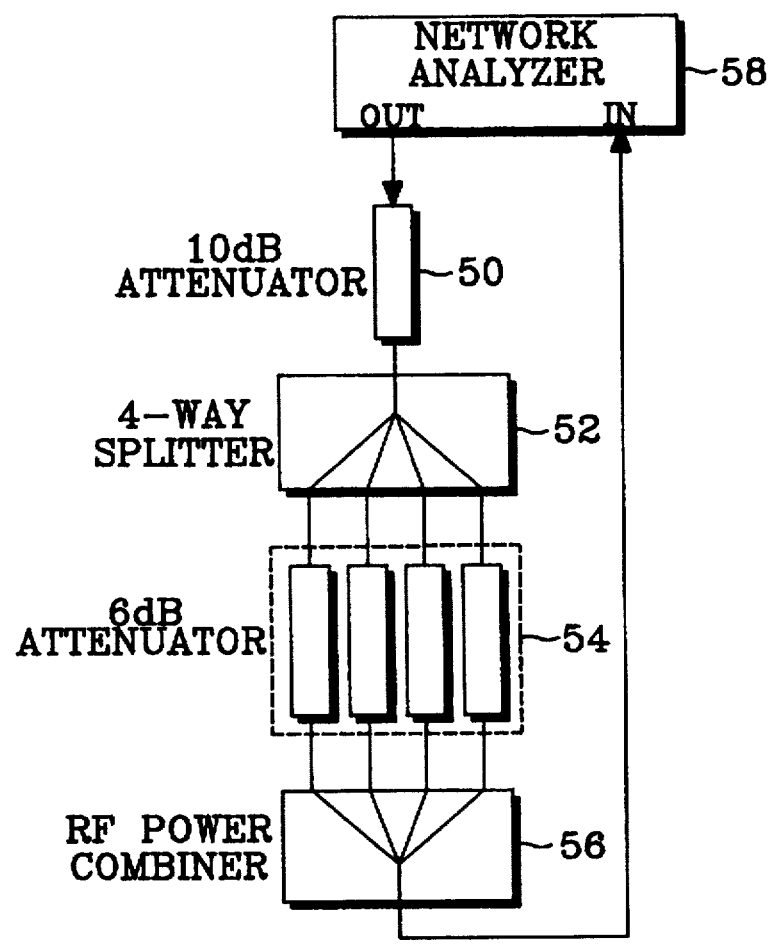
FIG. 5 is block diagram of a test set-up device for testing the power combiner shown in FIG. 4.

The output power of the illustrative power combiner is measured by using a test set-up device shown in FIG. 5. The test set-up device includes a 10 dB attenuator 50, a 4-way splitter 52, a 6 dB attenuator 54, an RF power combiner 56 and a network analyzer 58. The network analyzer 58 applies a signal to the output port OUT, receives the result of the tested signal at an input port IN, and analyzes the signal. The analysis is conducted to determine the feasibility of performing a signal combination and the loss of the combined signal, and the analyzed contents are displayed. The 10 dB attenuator 50 and 6 dB attenuator 54 are used to prevent the transmission line impedance from being mismatched, so such prevention eliminates a measurement error.

On the basis of the power of an input signal, the power is increased linearly in accordance with the number of input signals, that is, 0 dB, 3 dB (two times), 4.8 dB (three times) and 6 dB (four times) for 1, 2, 3 and 4 input signals, respectively. In other words, the characteristics of the circuit according to the embodiment of the present invention are as follows:

TABLE 3

| Number of input signals | Gain by combination (one input signal basis) | | |
|---|---|---|---|
| | 830 MHz | 880 MHz | 930 MHz |
| 1 | −0.595 dB | −0.505 dB | −0.595 dB |
| 2 | +2.949 dB | +3.0 dB | +2.949 dB |
| 3 | +4.584 dB | +4.590 dB | +4.584 dB |
| 4 | +5.483 dB | +5.482 dB | +5.483 dB |

According to the results shown in the above Table 3, the power is combined to be −0.5 dB (0.89 times), 3.0 dB (2.0 times), 4.6 dB (2.88 times) and 5.5 dB (3.55 times), respectively, when the signals number 1, 2, 3 and 4, respectively, at the central frequency of 880 MHz. Also, a frequency flatness within 0.1 dB is maintained in the band of ±50 MHz.

Figure 6A:
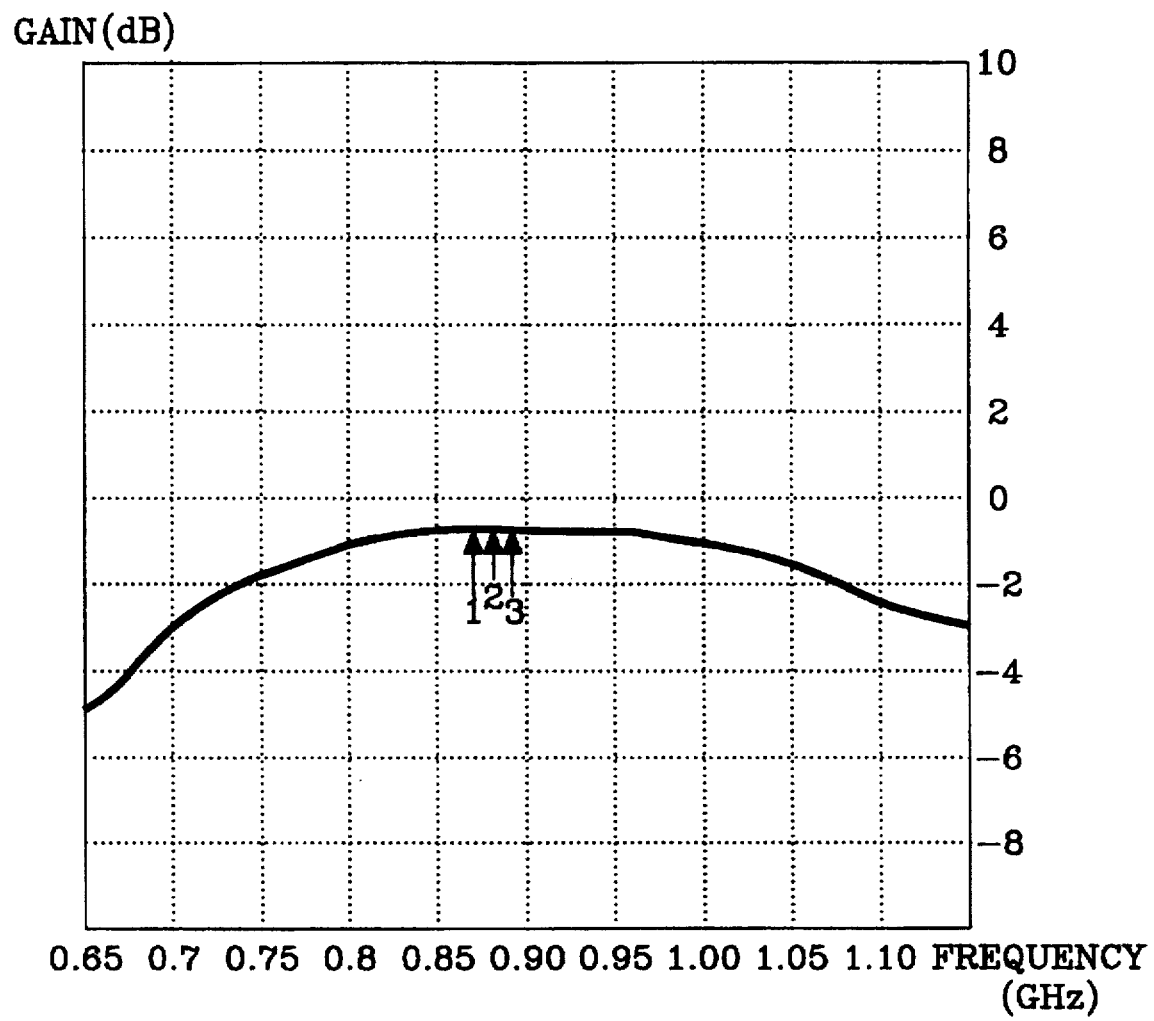
FIGS. 6A through 6D show test results of the power combiner.
Figure 6B:
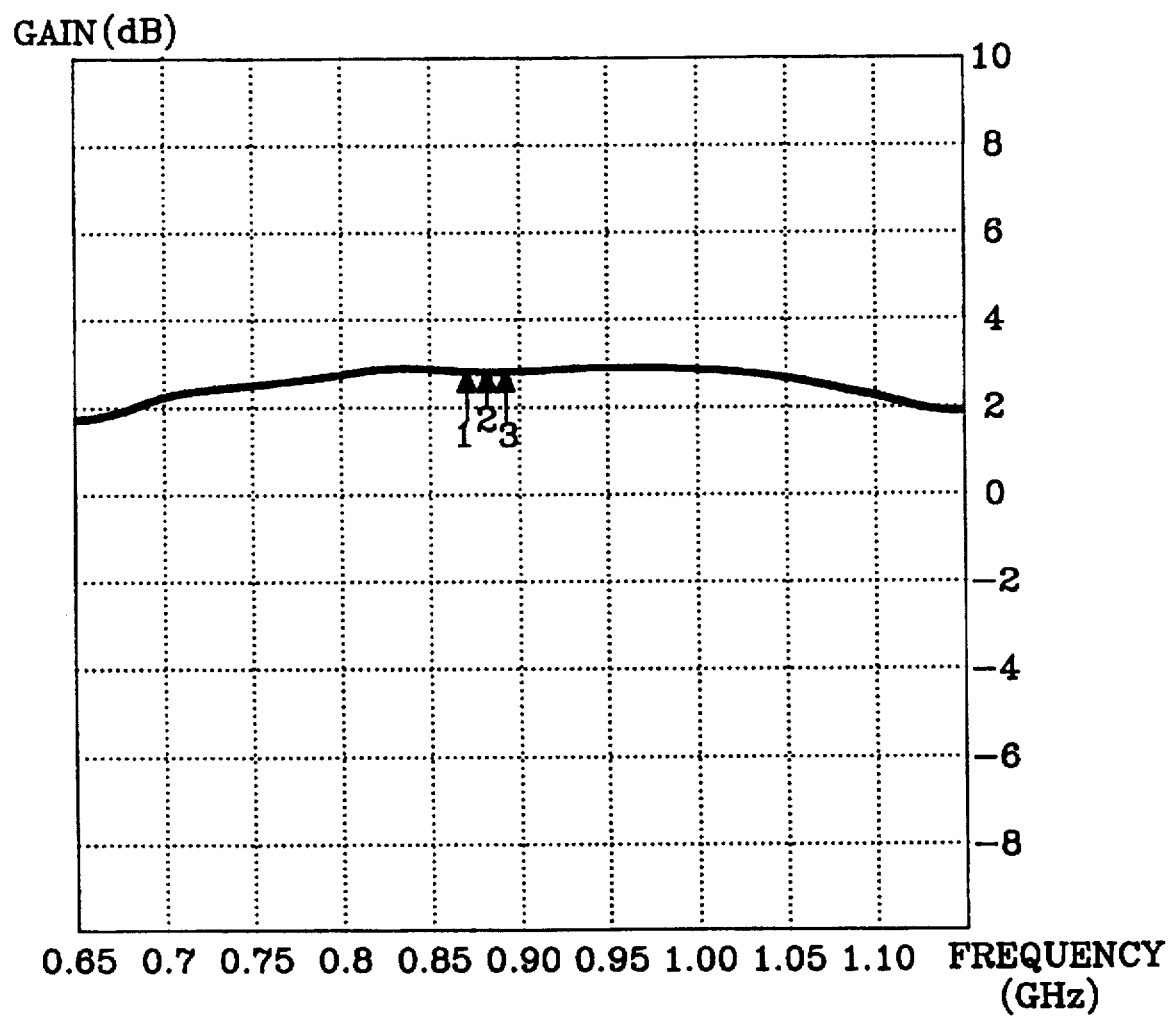
Figure 6C:
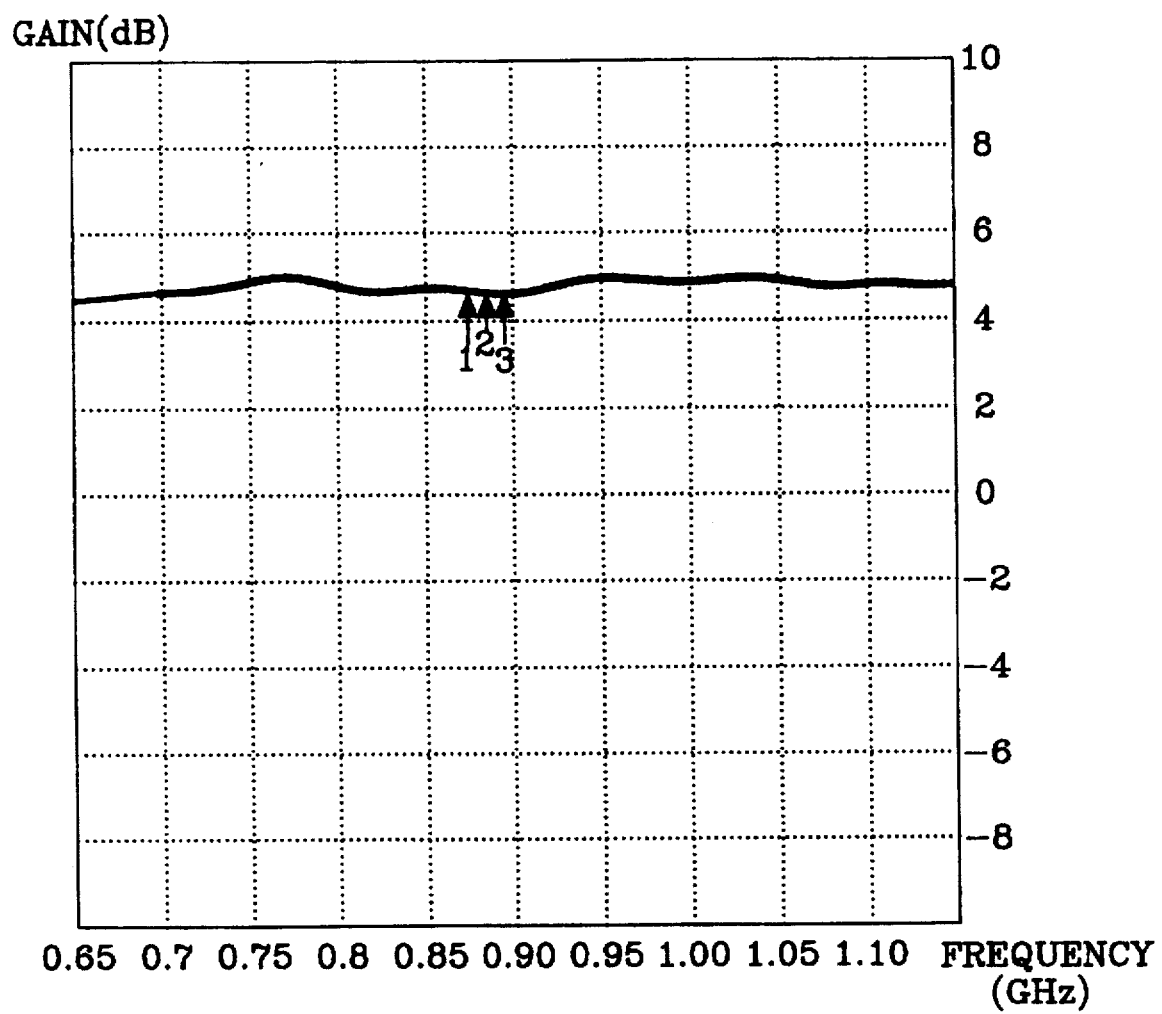
Figure 6D:
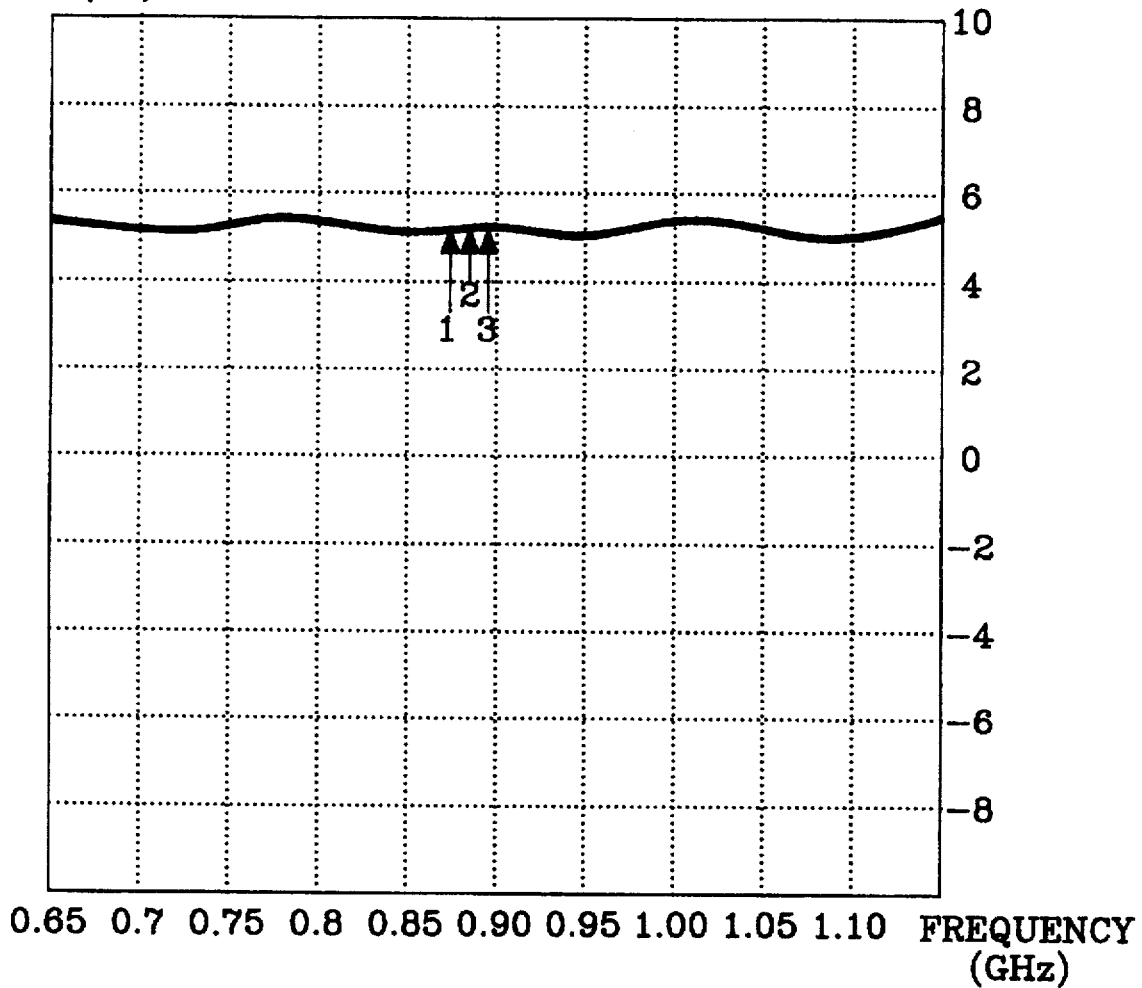

FIGS. 6A through 6D show measurement results of an experimental circuit formed with a microstrip line using a substrate composed of polytetrafluroethylene, commercially available as "TEFLON" from DUPONT, and an RF switch (e.g., a model MMS-12-F-PC manufactured by K&L Inc. in the U.S.A.). FIG. 6A shows a measurement result in the case when there is one input signal of the RF power combiner 56, FIG. 6B shows a measurement result in the case when there are two input signals of the RF power combiner 56, FIG. 6C shows a measurement result in the case when there are three input signals of the RF power combiner 56, and FIG. 6D shows a measurement result in the case when there are four input signals of the RF power combiner 56.

Referring to FIGS. 6A through 6D, the gain of the respective signals according to their numbers 1, 2, 3 and 4 in the central frequency are measured as −0.58 dB (0.87 times), 2.87 dB (1.93 times), 4.45 dB (2.79 times) and 5.40 dB (3.47 times). The frequency flatness of 0.1 dB or less is maintained in the band of +50 MHz around 880 MHz.

Based on the experimental results, the characteristics of the power combiner according to the present invention are compared below with those results of the prior art power combiner, according to the following conditions:

(1) the number of input ports n=4;

(2) the number of defective input signals=m;

(3) the power of input signals: each 1 watt (W), 4 watts in total; and (4) the amplitude and phase of input signals are all the same.

The following Table 4 shows the characteristics of combined power using the circuit of the present invention.

TABLE 4

| Number of input signals (n) | Number of defective signals (m) | Sum power of input signals before combination (watt) | Power after combination (watt) | Loss (%) |
|---|---|---|---|---|
| 4 | 0 | 4 | 3.55 | 11 |
| 4 | 1 | 3 | 2.88 | 4 |
| 4 | 2 | 2 | 2 | 0 |
| 4 | 3 | 1 | 0.89 | 11 |

In contrast to Table 1 for the prior art power combiner, from Table 4, it is understood that in the circuit of the present invention, the combined power is in proportion to the number of actual input signals (n-m), i.e., being nominal in linear characteristics.

The power combiner of the present invention is applicable for power divider and RF power amplifier applications. That is, the power combiner can be used as a power divider by converting the output terminal of the power combiner of the present invention to be the input terminal of the power divider, and converting the input terminals of the power combiner to be the output terminals of the power divider. Then, the power divider can reduce the RF power loss (as shown in the Table 1) due to defective signals. In addition, it is possible to implement respective RF power amplifiers with each having an input terminal, an output terminal, an RF switch between the input/output terminals and a transmission line which satisfies the condition of $Z2 \geq Z3 > Z1$, allowing the RF power loss due to defective signals of the RF power amplifier to be reduced.

Accordingly, the power combiner according to the illustrative embodiments of the present invention can be applied to power divider and RF power amplifier applications with various modifications and changes. In the application of the power combiner of the present invention to be a power divider or an RF power amplifier, the loss due to the defective signals can be reduced, resulting in the increase of the total RF power.

As described above, according to the principles of the power combiner of the present invention, the output power of combined power amplifiers in proportion to the number of power amplifiers is increased with very small loss.

Therefore, it should be understood that the present invention is not limited to the particular embodiment disclosed herein as the best mode contemplated for carrying out the present invention, and that the present invention is not limited to the specific embodiments described in this specification.

What is claimed is:

1. A radio frequency power combiner comprising:

a plurality of input terminals and an output terminal commonly connected to said plurality of input terminals via a common connection node, a first transmission line having a first characteristic impedance being connected between said output terminal and said common connection node, second and third transmission lines having respective second and third characteristic impedances, connected between said common connection node and each of said input terminals, each of said transmission lines being about $\lambda_0/4$, wherein $\lambda_0$ is a wavelength of a central frequency signal; and an RF switch positioned between each of said input terminals and corresponding said third transmission line, for opening/closing a connection providing an RF signal applied to said input terminals.

2. The radio frequency power combiner as claimed in claim 1, wherein said first, second and third characteristic impedances Z1, Z2, Z3, respectively, satisfy the condition of $Z2 \geq Z3 > Z1$.

3. The radio frequency power combiner as claimed in claim 2, wherein said first characteristic impedance Z1 is about 43.3Ω, said second characteristic impedance Z2 is about 67.7Ω, and said third characteristic impedance Z3 is about 55.4Ω.

4. The radio frequency power combiner as claimed in claim 1, wherein said radio frequency power combiner operates as a power divider, wherein said output terminal of said radio frequency power combiner is an input terminal of said power divider and said input terminals of said radio frequency power combiner are output terminals of said power divider.

5. The radio frequency power combiner as claimed in claim 2, wherein said power combiner, when used in conjunction with a high power RF power amplifier having a plurality of RF amplifiers each coupled to one of said input terminals, is operative to prevent at substantial reduction in output power of said high power RF power amplifier, by means of at least one said RF switch connected to at least one failed RF amplifier being open to thereby reflect power applied thereat.

6. The power combiner as claimed in claim 1, further including:

means for closing a selected plurality of said switches contemporaneously to enable a corresponding plurality of signals to flow between a corresponding plurality of said input terminals and said output terminal; and means for selectively opening any given one of said switches, whereby impedance from said common connection node looking into said second and third transmission line connected to said given switch is substantially that of an open circuit transmission line.

7. A radio frequency power combiner comprising:

four input terminals and an output terminal commonly connected to said four input terminals via a common connection node, a first transmission line having a first characteristic impedance being connected between said output terminal and said common connection node, second and third transmission lines having respective second and third characteristic impedances connected between said common connection node and each of said input terminals, each of said transmission lines being about $\lambda_0/4$, wherein $\lambda_0$ is a wavelength of a central frequency signal; and an RF switch positioned between each of the four input terminals and corresponding said third transmission line, for opening/closing a connection providing an RF signal applied to said input terminals.

8. The radio frequency power combiner as claimed in claim 7, wherein said first, second and third characteristic impedances Z1, Z2, Z3, respectively, satisfy the condition of $Z2 \geq Z3 > Z1$.

9. The radio frequency power combiner as claimed in claim 8, wherein said first characteristic impedance Z1 is about 43.3Ω, said second characteristic impedance is about 67.7Ω, and said third characteristic impedance is about 55.4Ω.

10. The radio frequency power combiner as claimed in claim 8, wherein the power of signals at said input terminals are combined to be about −0.5 dB, about 3.0 dB, about 4.6 dB, and about 5.5 dB, with the power being a function of the number of the signals selected by said RF switches.

11. The radio frequency power combiner as claimed in claim 8, wherein a frequency flatness of less than or equal to about 0.1 dB is maintained within a central frequency band ±50 MHz of said RF signal.

12. A radio frequency power combiner comprising:
   a plurality of input terminals and an output terminal commonly connected to said plurality of input terminals via a common connection node, a first transmission line having a first characteristic impedance being connected between said output terminal and said common connection node, second and third transmission lines having respective second and third characteristic impedances, connected between said common connection node and each of said inputs terminals; and
   an RF switch positioned between each of said input terminals and corresponding said third transmission line, for opening/closing a connection providing an RF signal applied to said input terminals;
   wherein the RF switches are provided in a predetermined open and closed configuration for causing an input signal applied to the transmission lines connected to the open switches to be substantially reflected at the common connection node.

13. The radio frequency combiner as claimed in claim 12 wherein, when only one of the plurality of RF switches is closed and the remaining RF switches are open, the input signal applied to the transmission lines connected to the open switches is substantially reflected at the common connection node.

14. The radio frequency combiner as claimed in claim 13 wherein, when an input signal is applied to the transmission line connected to the only closed RF switch, the input signal is transmitted through the closed RF switch to the output terminal.

15. The radio frequency combiner as claimed in claim 12 wherein, when only two of the plurality of RF switches are closed and the remaining RF switches are open, the input signal applied to the transmission lines connected to the open switches is substantially reflected at the common connection node.

16. The radio frequency combiner as claimed in claim 15 wherein, when a plurality of input signals are applied to the transmission lines connected to the only two closed RF switches and the plurality of input signals have substantially identical signal characteristics, the plurality of the input signals are transmitted through the closed RF switches to the output terminal.

17. The radio frequency combiner as claimed in claim 16 wherein substantially identical signal characteristics of the input signals include substantially identical amplitudes.

18. The radio frequency combiner as claimed in claim 16 wherein substantially identical signal characteristics of the input signals include substantially identical phases.

19. The radio frequency power combiner as claimed in claim 15, wherein said first, second and third characteristic impedances Z1, Z2, Z3, respectively, satisfy the condition of Z2≧Z3>Z1.

20. The power combiner as claimed in claim 12, further including:
   means for closing a selected plurality of said switches contemporaneously to enable a corresponding plurality of signals to flow between a corresponding plurality of said input terminals and said output terminal; and
   means for selectively opening any given one of said switches, whereby impedance from said common connection node looking into said second and third transmission line connected to said given switch is substantially that of an open circuit transmission line.

21. A power divider comprising:
   a plurality of output terminals and an input terminal commonly connected to said plurality of output terminals via a common connection node, a first transmission line having a first characteristic impedance being connected between said input terminal and said common connection node, second and third transmission lines having respective second and third characteristic impedances, connected between said common connection node and each of said output terminals, each of said transmission lines being about $\lambda_0/4$, wherein $\lambda_0$ is a wavelength of a central frequency signal; and
   an RF switch positioned between each of said output terminals and corresponding said third transmission line, for opening/closing a connection providing an RF signal applied to said output terminals.

22. The power divider as claimed in claim 21, wherein said first, second and third characteristic impedances Z1, Z2, Z3, respectively, satisfy the condition of Z2≧Z3>Z1.

23. The power divider as claimed in claim 21, further including:
   means for closing a selected plurality of said switches contemporaneously to enable a corresponding plurality of signals to flow between a corresponding plurality of said input terminals and said output terminal; and
   means for selectively opening any given one of said switches, whereby impedance from said common connection node looking into said second and third transmission line connected to said given switch is substantially that of an open circuit transmission line.

* * * * *